(12) United States Patent
Wilk

(10) Patent No.: US 6,859,055 B2
(45) Date of Patent: Feb. 22, 2005

(54) PROBE PIN ARRAY FOR SOCKET TESTING

(75) Inventor: Brian Wilk, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 217 days.

(21) Appl. No.: 09/783,841

(22) Filed: Feb. 13, 2001

(65) Prior Publication Data

US 2002/0109513 A1 Aug. 15, 2002

(51) Int. Cl.⁷ .............................................. G01R 31/02
(52) U.S. Cl. ...................................... 324/755; 324/754
(58) Field of Search .............................. 324/754, 755, 324/761, 762, 158.1, 765; 439/482

(56) References Cited

U.S. PATENT DOCUMENTS

| | | | |
|---|---|---|---|
| 3,599,093 A | * 8/1971 | Oates | 324/149 |
| 4,496,903 A | * 1/1985 | Paulinski | 324/761 |
| 4,701,703 A | * 10/1987 | Malloy | 324/72.5 |
| 5,850,148 A | * 12/1998 | Nam | 324/761 |
| 5,955,888 A | * 9/1999 | Frederickson et al. | 324/761 |
| 6,064,195 A | 5/2000 | Clayton et al. | |
| 6,198,300 B1 | * 3/2001 | Doezema et al. | 324/762 |
| 6,356,090 B2 | * 3/2002 | Deshayes | 324/754 |

* cited by examiner

Primary Examiner—Evan Pert
Assistant Examiner—Tung X. Nguyen
(74) Attorney, Agent, or Firm—Rob G. Winkle

(57) ABSTRACT

The present invention includes an assembly for testing a socket. The assembly includes a plurality for probe pins extending from a housing. The housing includes a chamfered alignment guide for aligning the probe pins with openings in the socket.

17 Claims, 6 Drawing Sheets

PROBE PIN ARRAY FOR SOCKET TESTING

BACKGROUND OF THE INVENTION

1. Field of the Invention

The present invention relates to an apparatus for testing electrical sockets with a test probe. In particular, the present invention relates to a probe pin array having tapered pins and at least one chamfered alignment guide for aligning the probe pin array for inserting the pins into the electrical socket.

2. State of the Art

For versatility and ease of microelectronic device replacement, many microelectronic substrates include electrical sockets mounted thereon. The microelectronic devices have a plural of pins, known as a "pin grid array" or "PGA" extending from a surface thereof, which electrically connects to circuitry within the microelectronic device. The electrical socket has a plurality of openings, having electrical terminals therein, in a mirror image of the microelectronic device PGA for receiving the same. The PGA/socket connection allows for electrical communication between the microelectronic substrate and the microelectronic device, and allows a non-permanent attachment therebetween. The microelectronic substrate may include, but is not limited to, motherboards, peripheral cards, and the like. The microelectronic device may include, but is not limited to, logic (CPUs), memory (DRAM, SRAM, SDRAM, etc.), controllers (chip sets), and the like.

After being attached to the microelectronic substrate, the electrical sockets are usually tested to verify that they are connected and functioning properly. The electrical sockets may be tested by the inserting a test probe therein. The test probe generally comprises a housing, which is shaped in about the same dimensions as the microelectronic device to be subsequently inserted. A plurality of probe pins is distributed in a mirror image of the plurality of the openings. The microelectronic substrate is placed on an X-Y test bed and a testing system with the test probe attached thereto moves to align with the electrical socket. The test probe is then lowered and the probe pins are pressed into place in the electrical socket openings making electrical contact therewith, which allows tests to be run on the electrical socket.

One problem with this testing system is that the electrical sockets on a microelectronic substrate are not always accurately positioned. They may be misaligned in the X-axis and/or Y-axis of the microelectronic substrate. Pressing the probe pins into a misaligned electrical socket can damage the terminals of the electrical socket, can bend the probe pins, may result in inaccurate test results, and/or can lead to shortened life for both the electrical socket and the probe pins.

Therefore, it would be advantageous to develop an electrical socket testing apparatus to insert probe pins into an electrical socket, which overcomes the above-discussed problems.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Figure 1:
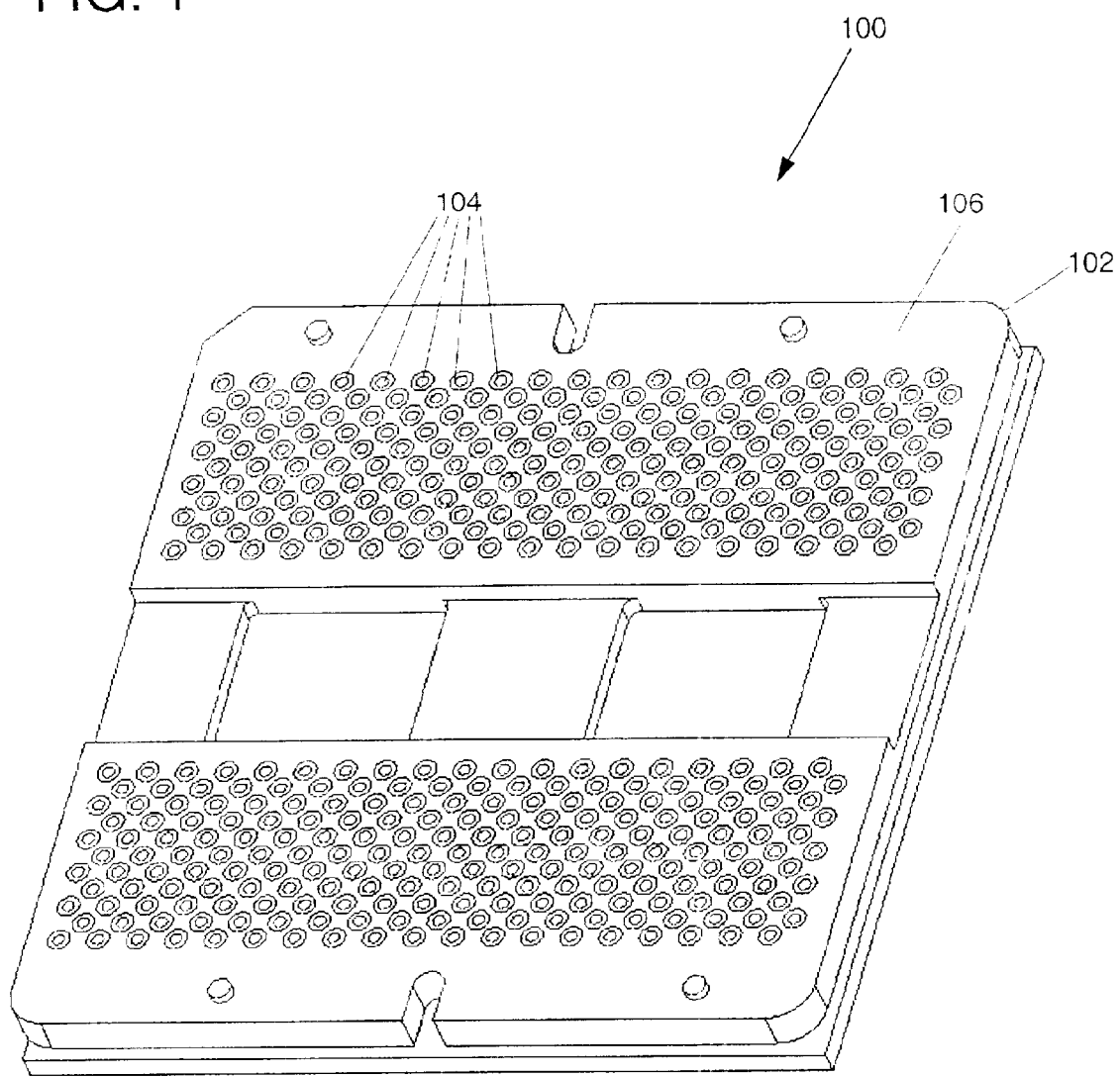
FIG. 1 is a front oblique view of a carrier assembly.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention includes an assembly for testing a socket. The assembly includes a plurality for probe pins extending from a housing. The housing includes at least one chamfered alignment guide for aligning the probe pins with openings in the socket. The assembly, hereinafter referred to a "probe pin array", may be used to test electrical sockets, socket connections, and the like.

Figure 2:
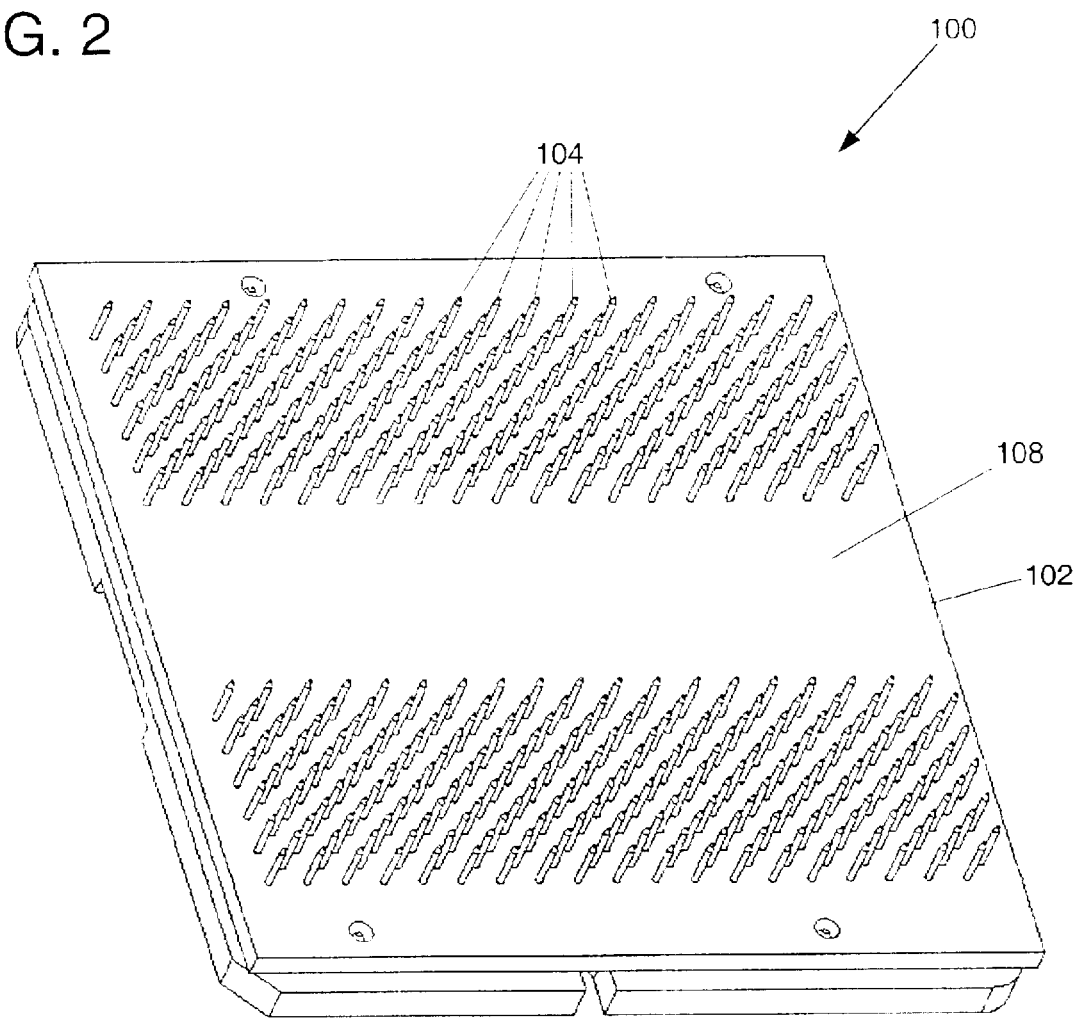
FIG. 2 is a back oblique view of the carrier assembly.

FIGS. 1 and 2 illustrate a carrier assembly 100 of the present invention. As shown in FIGS. 1 and 2, the carrier assembly 100 comprises a carrier 102 having a plurality of probe pins 104 that extend from a first surface 106 of the carrier 102 (see FIG. 1), through the carrier 102 to a second surface 108 thereof, and extend substantially perpendicularly from the carrier second surface 108 (see FIG. 2). The probe pins 104 are patterned to match (mirror image) a plurality of corresponding socket openings (not shown). It is, of course, understood that the probe pins 104 may be in any arrangement desired. External electronic leads (not shown) are attached to the probe pins 104 on the carrier first surface 106 to deliver and receive electronic testing signals to and from the probe pins 104.

Figure 3:
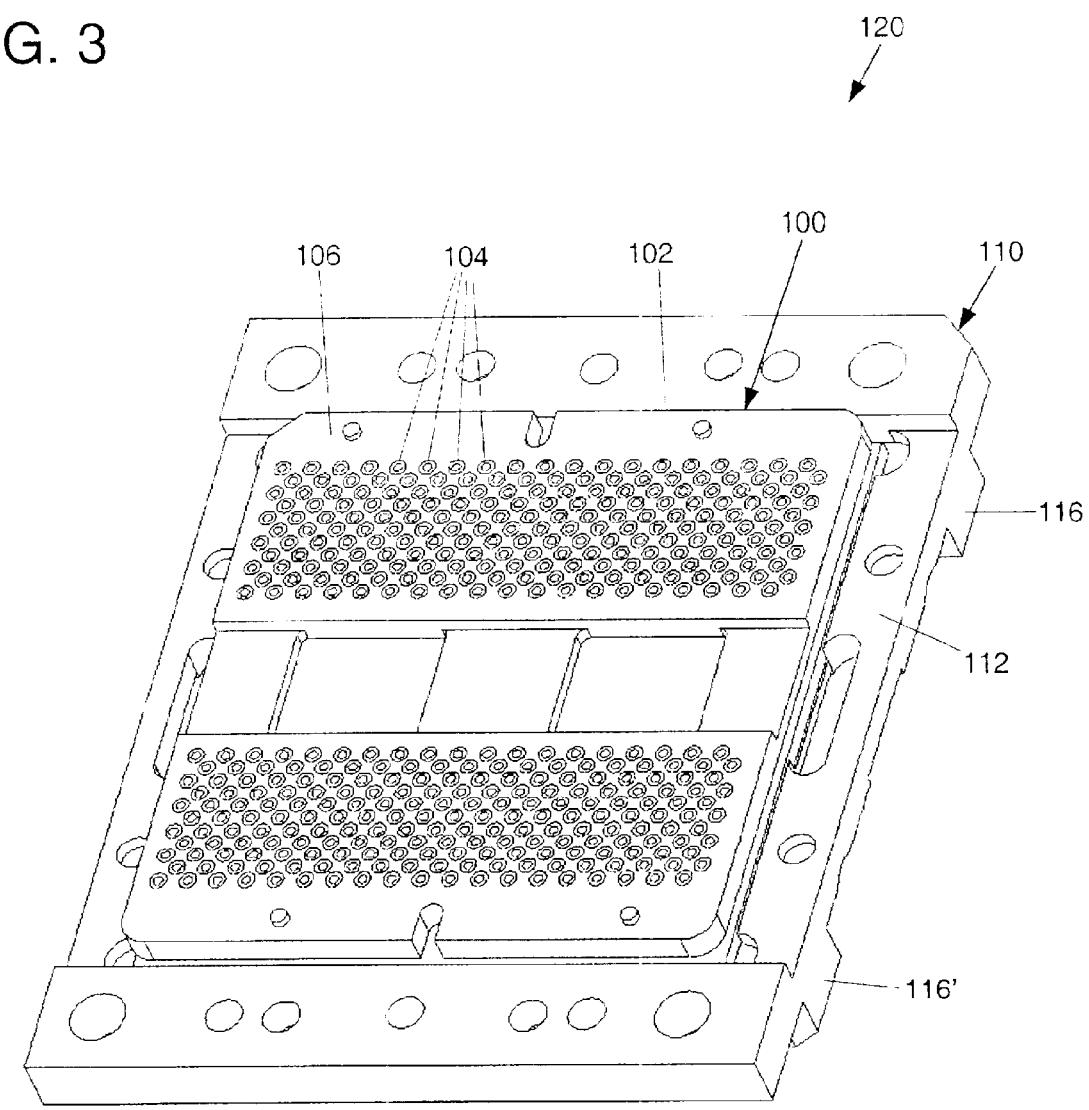
FIG. 3 is a back oblique view of the carrier assembly inserted in a housing.
Figure 4:
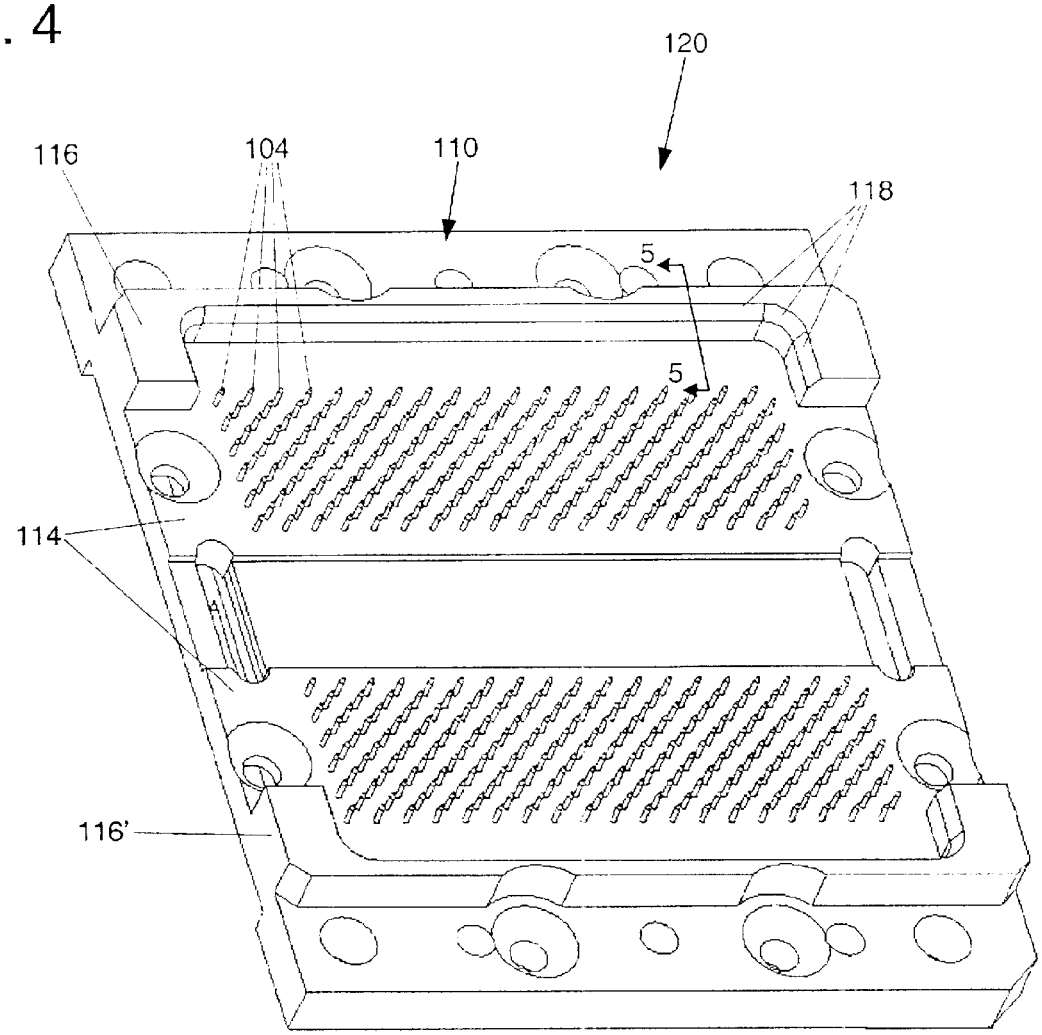
FIG. 4 is a front oblique view of the carrier assembly inserted in the housing.

As shown in FIGS. 3 and 4, the present invention also includes a housing 110 into which the carrier assembly 100 is inserted to form the probe pin array 120. The probe pins 104 are inserted from a first surface 112 of the housing 110, through the housing 110, and extend substantially perpendicularly from a second surface 114 of the housing 110 (see FIG. 4). With such a configuration, the carrier second surface 108 abuts the housing second surface 114. The housing second surface 114 includes at least one alignment guide (shown as elements 116 and 116') which is/are shaped to substantially match the size of the socket (not shown) to be tested. The alignment guides 116 and 116' assist in orienting and aligning the probe pins 104 to the openings in the electrical socket to be tested. The alignment guides 116 and 116' have at least one chamfered surface 118 oriented toward the probe pins 104 to allow probe pin array 120 to be slightly out of alignment when it first contacts the electrical socket (not shown). As the probe pin array 120 is pressed onto the socket, the alignment guides 116 and 116' orient the probe pin array 120 into proper alignment. Although the alignment guides 116 and 116' are shown to be wall-like guide extending substantially perpendicularly from the housing second surface 114, they may be of any applicable size and shape, as will be evident to one skilled in the art.

Figure 5:
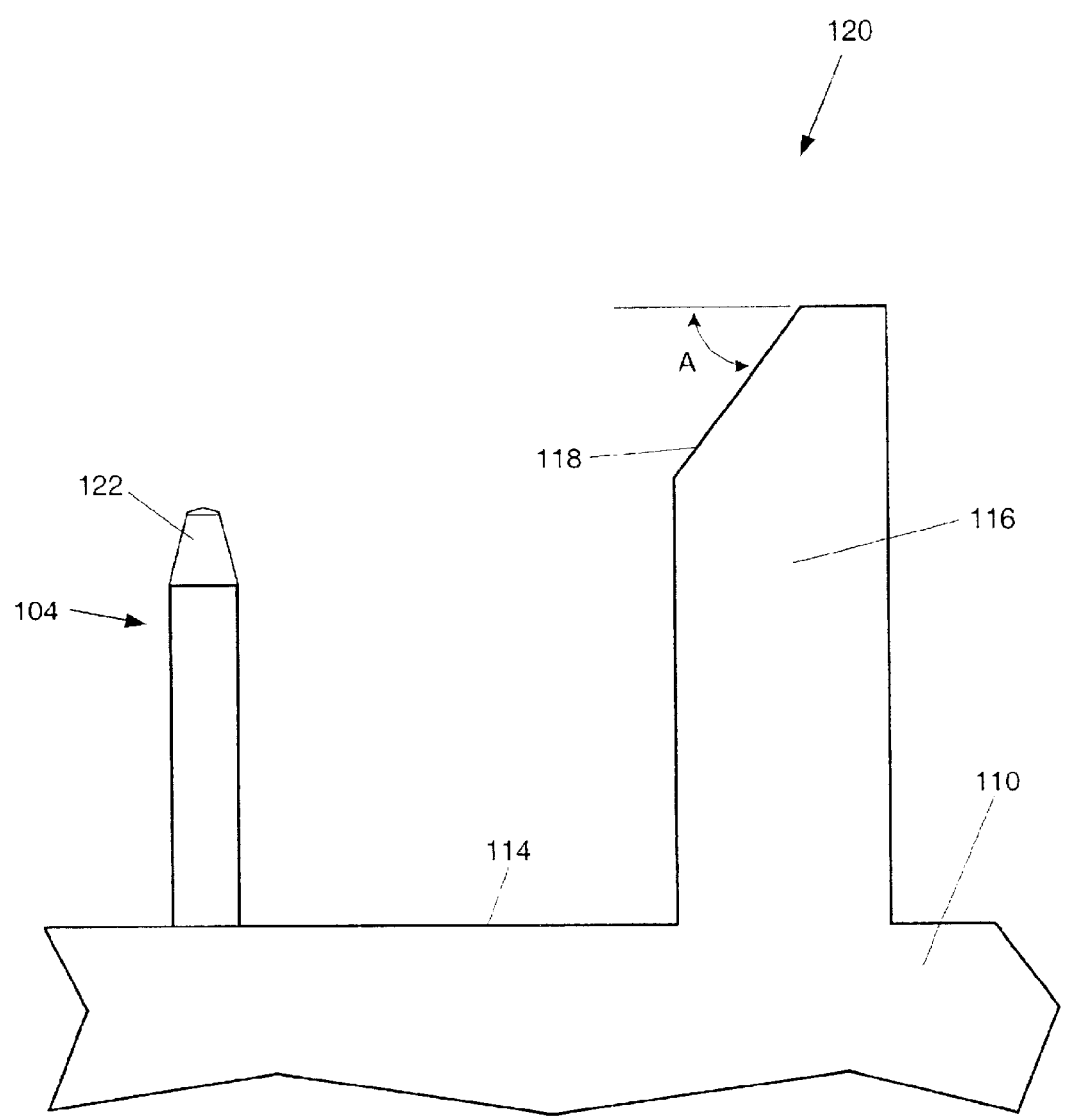
FIG. 5 is a cross-sectional view of the alignment guide along line 5—5 of FIG. 4.

FIG. 5 illustrates a cross-sectional view of the alignment guide 116 along line 5—5 of FIG. 4. The angle A of the alignment guide chamfered surface 118 is preferably between about 45 and 70 degrees from planar with the housing second surface 114, most preferably about 60 degrees. The angle A of about 60 degrees allows the assembly to engage the electrical socket at a rotated angle of up to 5 degrees on an X/Y axis of a microelectronic substrate and still align the probe pins 104 to the electrical socket openings (not shown). FIG. 5 also illustrates a single probe pin 104. Preferably, a tip or leading end 122 of the probe pins 104 is slightly "below" the alignment guide chamfered surface 118, such that the alignment guide chamfered surface(s) 118 can align the probe pin array 120 prior to the probe pins 104 being inserted into the electrical socket (not shown).

It is noted that the alignment guides 116 and 116', as illustrated in FIG. 4, would not completely surround the electrical socket. In fact, to properly align the assembly, the alignment guides need only cover at least 10% of the length of each of the four sides of the electrical socket. This allows for the alignment guides to be designed to avoid various components and hardware mounted on the microelectronic substrate proximate the electrical socket. It is also noted that FIGS. 3–4 illustrate various holes (threaded holes, countersink holes, etc.) in the housing 110. These holes are used for application specific mounting of various hardware components and not specifically part of this present invention.

Figure 6:
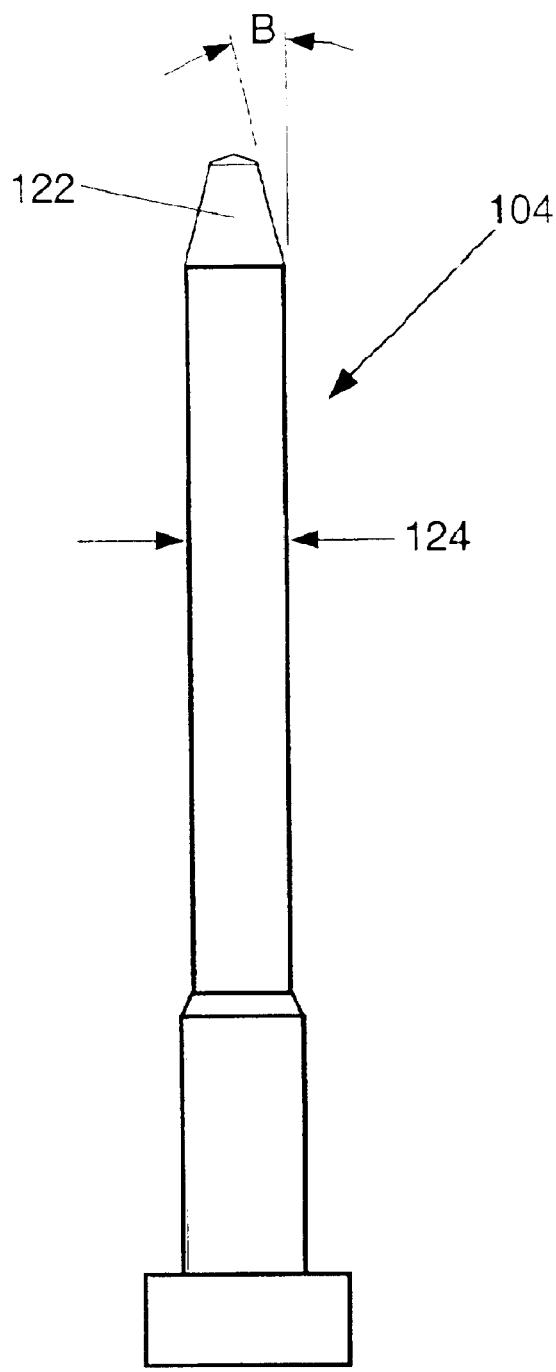
FIG. 6 is a side view of a single probe pin.

As shown in FIG. 6, each probe pin 104 is specifically designed for probing a socket, wherein the probe pin leading end 122 is tapered between about 10 and 25 degrees, preferably about 15 degrees, illustrated as angle B. The specific tapering is selected to allow the probe pin 104 to be inserted into the electrical socket opening without "catching" on the socket and bending. The tapered leading ends 122 allows a margin of error and self-alignment while sliding into the socket opening and making electrical contact therewith.

In an additional embodiment, the diameter 124 of the probe pin 104 may be reduced by between about 30% and 60% of the diameter of the pins of the PGA microelectronic device to be ultimately installed. This reduces the insertion force required to insert the probe pins 104 into the socket, thereby lowering the risk of bending any probe pins 104 during insertion, while still making sufficient electrical contact for testing purposes.

Although standard probe pins are generally copper, aluminum, and alloys thereof, a more rigid probe pin is preferred in the present invention. The probe pin 104 may be any rigid material, electrically conductive or non-conductive, including but not limited to, substantially stiff/rigid metals, ceramics, high impact plastics, and the like. If the rigid material is electrical non-conductive or not sufficiently electrically conductive, it may be coated with a highly conductive material, including but not limited to, nickel, copper, brass, bronze, gold, and silver. In a preferred embodiment, the probe pin 104 is steel (such as heat treated tool steel) approximately 0.017 inches in diameter 124 coated with gold about 0.001 inches thick. Additionally, the preferred embodiment of a gold-coated steel probe pin, rather than a standard copper or aluminum probe pin, results in a stronger probe pin even though the diameter may have been reduced, as discussed above.

Furthermore, probe pins 104 comprising a rigid material allow for the testing of proper soldering (i.e., sufficient electrical conductivity) between the electrical socket to the microelectronic substrate. To test the electrical conductivity between the electrical sockets and the microelectronic substrate, there should be no or very little pressure on the electrical socket that could possibly close any open solder joints. Thus, no spring-loaded pogo type of probe pins should be used, as the pressure from the spring could close any open solder joints. Thus, a preferred method of testing an electrical solder is to press the probe pins 104 into the electrical socket and, when the probe pins 104 are seated, relieving the pressure prior to testing.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A probe pin array, comprising:
    a housing having a first surface and a second surface; and
    a plurality of probe pins extending between said housing first surface and said housing said second surface, wherein said plurality of probe pins extend substantially perpendicularly from said housing second surface and wherein said plurality of probe pins each further include a leading end having a taper between about 10 and 25 degrees, and wherein said plurality of probe pins each has a diameter of between about 30% and 60% of a diameter of a pin of a pin grid array microelectronic device to be inserted into a socket to be tested by said plurality of probe pins.

2. The probe pin array of claim 1, wherein said leading end taper is about 15 degrees.

3. The probe pin array of claim 1, wherein said plurality of probe pins each comprise steel coated with gold.

4. A probe pin array, comprising:
    a housing having a first surface and a second surface; and
    a plurality of probe pins extending between said housing first surface and said housing said second surface, wherein said plurality of probe pins extend substantially perpendicularly from said housing second surface and wherein said plurality of probe pins each further include a leading end having a taper between about 10 and 25 degrees, and
    an alignment guide extending from said housing second surface having a chamfered surface with an angle of between about 45 and 70 degrees from planar with said housing second surface.

5. The probe pin array of claim 4, wherein said chamfered surface has an angle of about 60 degrees from planar with said housing second surface.

6. A probe pin array, comprising:
    a housing having a first and a second surface;
    a plurality of non-spring loaded probe pins extending between said housing first surface and said housing second surface, wherein said plurality of non-spring loaded probe pins extend substantially perpendicularly from said housing second surface, wherein said plurality of probe pins each has a diameter of between about 30% and 60% of a diameter of a pin of a pin grid array microelectronic device to be inserted into a socket to be tested by said plurality of probe pins; and at least one alignment guide extending from said housing second surface having at least one chamfered surface oriented toward said plurality of non-spring loaded probe pins.

7. The probe pin array of claim 6, wherein said plurality of probe pins each further include a leading end having a taper between about 10 and 25 degrees.

8. The probe pin array of claim 7, wherein said leading end taper is about 15 degrees.

9. The probe pin array of claim 6, wherein said plurality of probe pins each comprise steel coated with gold.

10. A probe pin array, comprising:

a housing having a first and a second surface;

a plurality of non-spring loaded probe pins extending between said housing first surface and said housing second surface, wherein said plurality of non-spring loaded probe pins extend substantially perpendicularly from said housing second surface; and at least one alignment guide extending from said housing second surface having at least one chamfered surface oriented toward said plurality of non-spring loaded probe pins, wherein said alignment guide chamfered surface has an angle of between about 45 and 70 degrees from planar with said housing second surface.

11. The probe pin array of claim 10, wherein said chamfered surface has an angle of about 60 degrees from planar with said housing second surface.

12. A probe pin array, comprising:

a housing having a first and a second surface;

a carrier having a first surface and a second surface, wherein said carrier second surface abuts said housing first surface;

a plurality of non-spring loaded probe pins extending between said housing first surface and said housing second surface and extending between said housing first surface and said housing second surface, wherein said plurality of non-spring loaded probe pins extend substantially perpendicularly from said housing second surface, and wherein said plurality of probe pins each has a diameter of between about 30% and 60% of a diameter of a pin of a pin grid array microelectronic device to be inserted into a socket to be tested by said plurality of probe pins; and at least one alignment guide extending from said housing second surface having at least one chamfered surface oriented toward said plurality of non-spring loaded probe pins.

13. The probe pin array of claim 12, wherein said plurality of probe pins each further include a leading end having a taper between about 10 and 25 degrees.

14. The probe pin array of claim 13, wherein said leading end taper is about 15 degrees.

15. The probe pin array of claim 12, wherein said plurality of probe pins each comprise steel coated with gold.

16. A probe pin array, comprising:

a housing having a first and a second surface;

a carrier having a first surface and a second surface, wherein said carrier second surface abuts said housing first surface;

a plurality of non-spring loaded probe pins extending between said housing first surface and said housing second surface and extending between said housing first surface and said housing second surface, wherein said plurality of non-spring loaded probe pins extend substantially perpendicularly from said housing second surface; and at least one alignment guide extending from said housing second surface having at least one chamfered surface oriented toward said plurality of non-spring loaded probe pins, and wherein said alignment guide chamfered surface has an angle of between about 45 and 70 degrees from planar with said housing second surface.

17. The probe pin array of claim 16, wherein said chamfered surface has an angle of about 60 degrees from planar with said housing second surface.

* * * * *